(12) United States Patent
Cruse

(10) Patent No.: US 8,454,756 B2
(45) Date of Patent: Jun. 4, 2013

(54) METHODS FOR EXTENDING THE LIFETIME OF PRESSURE GAUGES COUPLED TO SUBSTRATE PROCESS CHAMBERS

(75) Inventor: James P. Cruse, Santa Cruz, CA (US)

(73) Assignee: Applied Materials, Inc., Santa Clara, CA (US)

( * ) Notice: Subject to any disclaimer, the term of this patent is extended or adjusted under 35 U.S.C. 154(b) by 228 days.

(21) Appl. No.: 12/905,029

(22) Filed: Oct. 14, 2010

(65) Prior Publication Data

US 2011/0265824 A1 Nov. 3, 2011

Related U.S. Application Data

(60) Provisional application No. 61/330,027, filed on Apr. 30, 2010.

(51) Int. Cl.
*B08B 9/00* (2006.01)
*B08B 5/00* (2006.01)

(52) U.S. Cl.
USPC ................. 134/22.1; 134/19; 134/21; 134/37

(58) Field of Classification Search
USPC .......................... 134/22.1, 19, 21, 37; 73/706
See application file for complete search history.

(56) References Cited

U.S. PATENT DOCUMENTS

| 5,011,537 | A | * | 4/1991 | Voegele et al. ............ 134/22.11 |
| 7,051,759 | B2 | | 5/2006 | Reimer et al. |
| 7,444,761 | B2 | | 11/2008 | Gray |
| 2002/0061605 | A1 | | 5/2002 | Hasegawa et al. |
| 2002/0194924 | A1 | * | 12/2002 | Ozawa .......................... 73/729.2 |
| 2007/0017798 | A1 | * | 1/2007 | Inagawa ..................... 204/192.1 |
| 2008/0066619 | A1 | | 3/2008 | Petinarides |

OTHER PUBLICATIONS

International Search Report and Written Opinion mailed Dec. 28, 2011 for PCT Application No. PCT/US2011/033330.

* cited by examiner

*Primary Examiner* — Michael Barr
*Assistant Examiner* — Caitlin N Dunlap
(74) *Attorney, Agent, or Firm* — Moser Taboada; Alan Taboada

(57) ABSTRACT

Methods of extending the lifetime of pressure gauges coupled to process chambers are disclosed herein. In some embodiments, the methods may include isolating the pressure gauge from a processing volume of the process chamber, increasing a moisture content of the processing volume to above a desired moisture level while the pressure gauge is isolated from the processing volume of the process chamber, reducing a moisture content of the processing volume to a desired moisture level, wherein the processing volume has a leak rate of about 2 mTorr/min or less at the desired moisture level, and exposing the pressure gauge to the processing volume after reaching the desired moisture level. In some embodiments, the moisture content of the process chamber may be increased by performing a cleaning process in the process chamber or by allowing air to enter the processing volume.

18 Claims, 3 Drawing Sheets

METHODS FOR EXTENDING THE LIFETIME OF PRESSURE GAUGES COUPLED TO SUBSTRATE PROCESS CHAMBERS

CROSS-REFERENCE TO RELATED APPLICATIONS

This application claims benefit of U.S. provisional patent application Ser. No. 61/330,027, filed Apr. 30, 2010, which is herein incorporated by reference.

FIELD

Embodiments of the present invention generally relate to substrate processing equipment, and more specifically to methods and apparatus for extending the lifetime of pressure gauges used in such processing equipment.

BACKGROUND

During processing of a substrate, a process chamber is exposed to process gases, for example such as in a etch or deposition process. As a result of such processing, contaminants, such as those formed from the interaction of the process gases and the substrate, deposit on the walls of the chamber as well as on other chamber components. Accordingly, a cleaning process is performed at desired intervals to remove these contaminants from the process chamber. Unfortunately, the inventor has discovered that the pressure gauge often fails after such a cleaning process. The inventor has discovered that, although the cleaning agents are removed from the process chamber after the cleaning process, there is residual moisture remaining in the process chamber that can corrode the pressure gauge—even though the pressure gauge is isolated during the cleaning process itself. The inventor has also discovered similar pressure gauge failures at other times when the chamber is opened, such as for part replacement, inspection, or the like. Thus, the inventor believes that residual moisture not completely removed from the process chamber (for example from the cleaning process or from exposing the chamber to air) is interacting with byproducts deposited in the tube that couples the pressure gauge to the process chamber upon opening the tube to expose the pressure gauge to the process chamber, leading to corrosion and failure of the pressure gauge.

Accordingly, the inventor has provided methods for limiting damage to a pressure gauge coupled to a process chamber resultant from cleaning the process chamber.

SUMMARY

Methods for extending the lifetime of pressure gauges are provided herein. In some embodiments, a method of extending the lifetime of a pressure gauge coupled to a process chamber may include isolating the pressure gauge from a processing volume of the process chamber, increasing a moisture content of the processing volume to above a desired moisture level while the pressure gauge is isolated from the processing volume of the process chamber, reducing the moisture content of the processing volume to or below the desired moisture level, wherein the processing volume has a leak rate of about 2 mTorr/min or less at the desired moisture level, and exposing the pressure gauge to the processing volume after reaching the desired moisture level.

In some embodiments, a method of extending the lifetime of a pressure gauge coupled to a process chamber may include isolating the pressure gauge from a processing volume of the process chamber, increasing a moisture content of the processing volume to above a desired moisture level while the pressure gauge is isolated from the processing volume of the process chamber, removing contaminants from the isolated pressure gauge, and exposing the pressure gauge to the processing volume after removing contaminants from the isolated pressure gauge.

In some embodiments, a method of extending the lifetime of a pressure gauge coupled to a process chamber may include isolating the pressure gauge from a processing volume of the process chamber, increasing a moisture content of the processing volume to above a desired moisture level while the pressure gauge is isolated from the processing volume of the process chamber, flowing a gas into the isolated pressure gauge to provide a first pressure in the pressure gauge that is greater than a second pressure in the process chamber prior to opening an isolation valve used to isolate the pressure gauge from the process chamber, and opening the isolation valve such that a flow direction of the gas is from the pressure gauge to the process chamber.

In some embodiments, the moisture content of the process chamber may be increased by performing a cleaning process in the process chamber or by allowing air to enter the processing volume.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
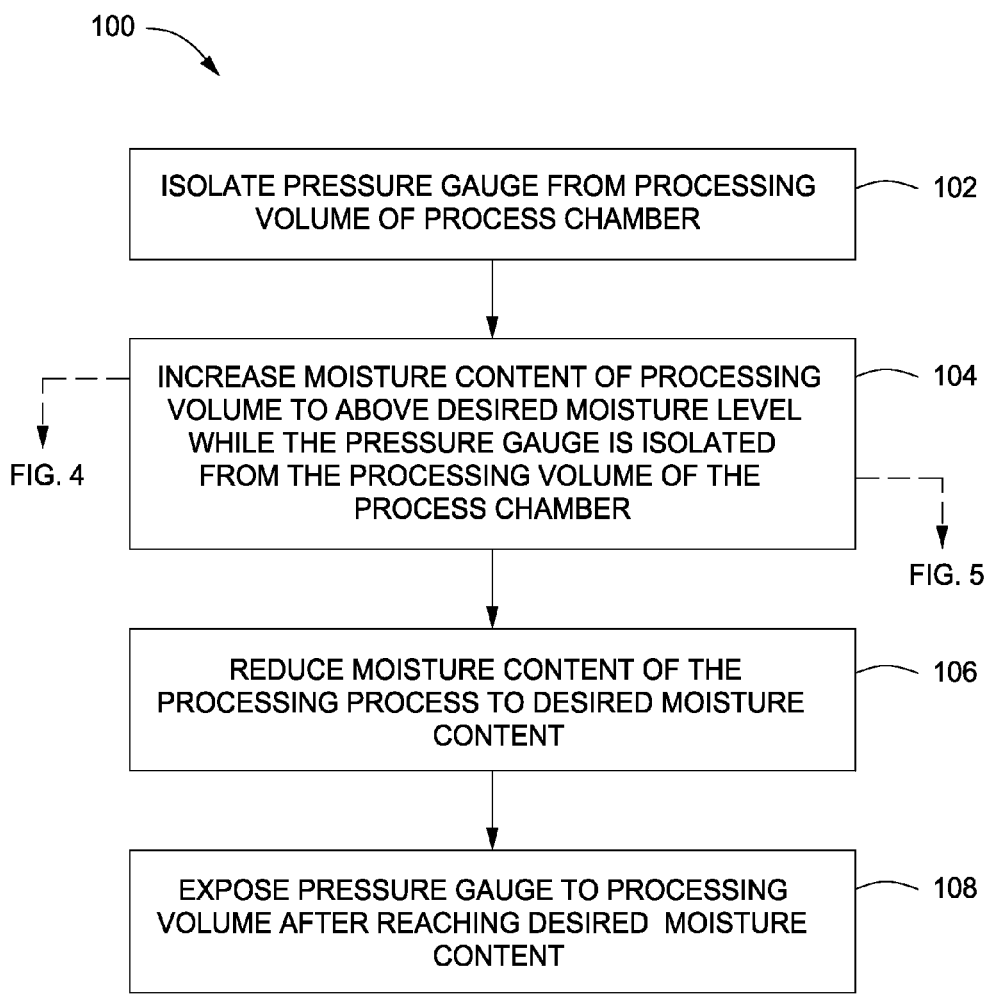
FIG. 1 depicts a flow chart for a method of extending the lifetime of a pressure gauge coupled to a process chamber in accordance to some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods of extending the lifetime of a pressure gauge coupled to a process chamber are disclosed herein. The inventive methods may advantageously limit damage to the pressure gauge in one or more of a number of embodiments. In some embodiments, the inventive methods may advantageously limit damage to the pressure gauge by reducing the exposure of the pressure gauge to residual moisture that may be present in the process chamber after a cleaning process or after exposing the process chamber to air (for example by reducing the moisture content resultant from the cleaning process or air exposure to a desired level, or by preventing the moisture in the chamber from entering a conduit coupling the pressure gauge to the chamber). In some embodiments, the inventive methods may advantageously limit damage to the pressure gauge by reducing the level of contaminants present in the process chamber and/or the conduit coupling the pressure gauge to the process chamber.

Figure 2:
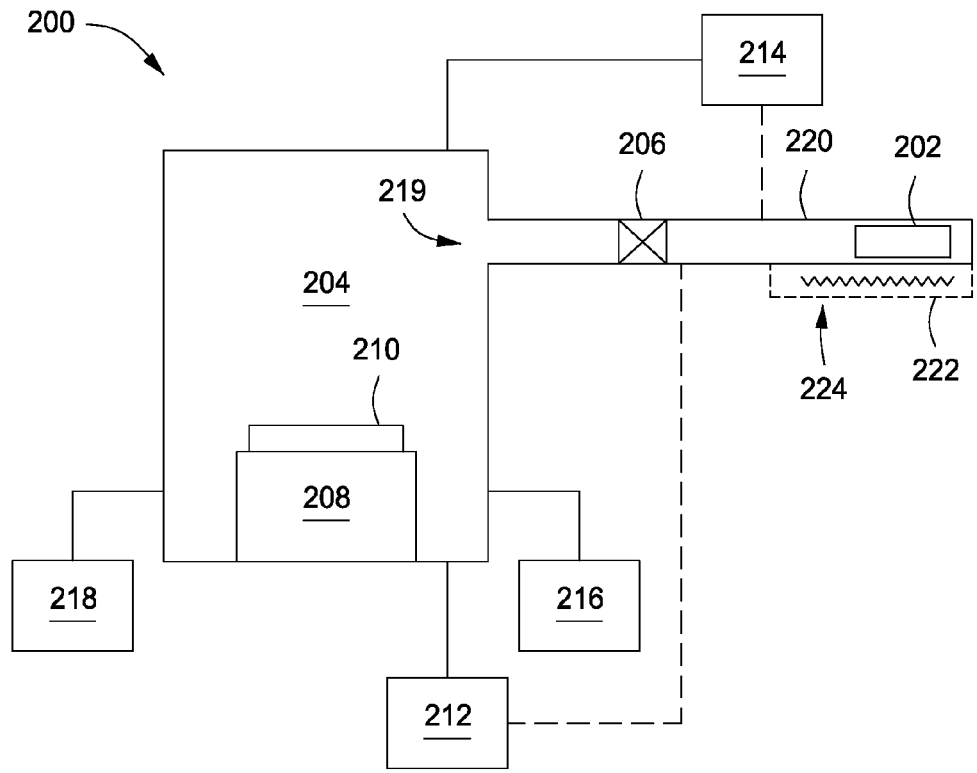
FIG. 2 depicts a schematic view of a process chamber that can be used in accordance with some embodiments of the inventive methods disclosed herein.
Figure 3:
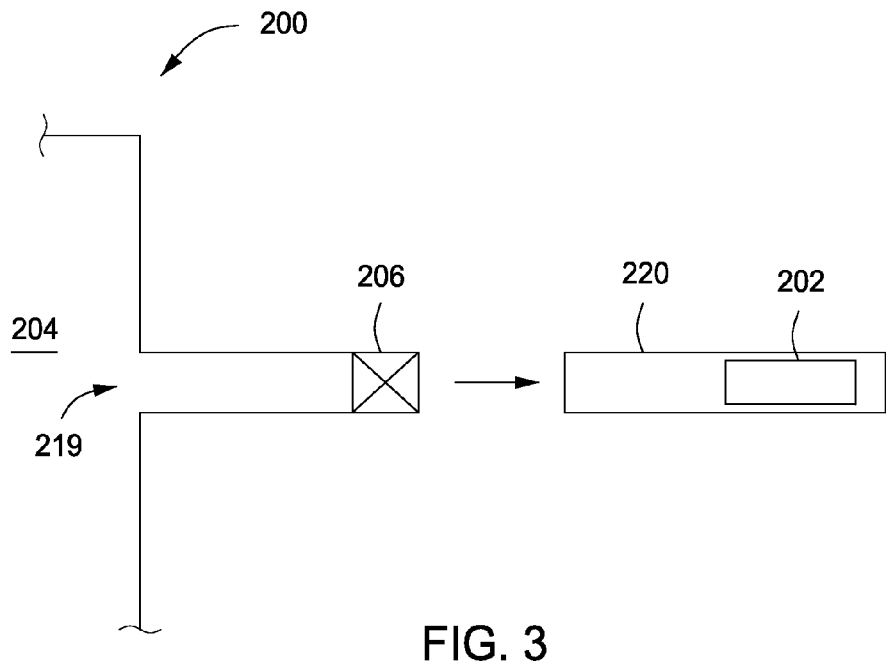
FIG. 3 depicts a partial schematic view of a removable pressure gauge that can be used in accordance with some embodiments of the inventive methods disclosed herein.

FIG. 1 depicts a flow chart of a method 100 of extending the lifetime of a pressure gauge coupled to a process chamber in accordance with some embodiments of the present invention. The method 100 is described below with respect to an exemplary process chamber 200 as illustrated in FIGS. 2-3. The inventive methods of the present invention can be utilized in any suitable process chamber or process system having a configuration where a pressure gauge can be corroded upon exposure to moisture, byproducts of a processing environment, cleaning residuals, or combinations thereof.

The method 100 begins at 102 by isolating a pressure gauge from a processing volume of a process chamber, for example prior to cleaning contaminants from surfaces of the processing volume of the process chamber or prior to exposing the processing volume to air (for example, for part cleaning, inspection, maintenance, replacement, or the like). The contaminants may be, for example, resultant from processing substrates within the process chamber. For example, and as illustrated in FIG. 2, a pressure gauge 202 can be isolated from the processing volume 204 of the processing chamber 200 by closing an isolation valve 206 disposed between the processing volume 204 and the pressure gauge 202. A processing volume side of the isolation gauge 206 may be disposed at the end of a port 219, where the port 219 is fluidly coupled to the processing volume 204.

For example, the interior surfaces of the process chamber 200, such as the walls of the chamber, components of the chamber, for example a substrate support 208 or the like, may have contaminants disposed thereon. The contaminants may be resultant from etch, deposition or like processes. For example, the contaminants may include remnant process gases, byproducts formed from a reaction between a substrate (such as a substrate 210 disposed on the substrate support 208) and the process gases, or the like. In some embodiments, the contaminants include at least one of polymers, hydrogen bromide (HBr), or chlorine ($Cl_2$).

During a chamber process, the contaminants found on the walls and components of the process chamber 200 and the port 219 can also accumulate on the interior surfaces of the pressure gauge 202 as the isolation valve 206 remains open during the processing of a substrate to monitor pressure, for example, during an etch or deposition process. The contaminants may also accumulate on a conduit 220 that couples the pressure gauge 202 to the process chamber 200 (or the pressure gauge may include the conduit 220 as part of the pressure gauge). Accordingly, when the pressure gauge 202 is isolated from the processing volume 204 of the process chamber 200 at 102, at least one of the pressure gauge 202, the conduit 220, the port 219 or the process chamber 200 can have contaminants disposed thereon.

In some embodiments, prior to isolating the pressure gauge 202 at 102, the processing volume 204 and the pressure gauge 202 may be purged with a purge gas. For example, the purge gas may be provided to the processing volume and/or the conduit 220 from a gas source, for example a gas source 214 (discussed below).

Further, while the purge gas is flowing, the isolation valve 206 may be closed to isolated the pressure gauge 202 from the processing volume 204. The purge gas may continue to flow after the isolation valve 206 has been closed and the chamber 200 may be vented (e.g., opened to atmosphere) to begin a cleaning process as discussed below.

Next, at 104, a moisture content of the processing volume may be increased to above a desired moisture level. The moisture content of the processing volume may be increased directly or indirectly due to a process or procedure being performed in the process chamber. For example, a cleaning process may be performed in the process chamber 200 to remove the contaminants from the interior surfaces and/or components of the process chamber 200 while the pressure gauge 202 is isolated from the processing volume 204 (for example, by keeping the isolation valve 206 closed). The cleaning process may be any suitable wet or dry cleaning process known in the art for removing contaminants from a process chamber. For example, the cleaning process include exposing the interior surfaces and/or components of the process chamber 200 to one or more cleaning agents such as one or more of isopropyl alcohol (IPA), water ($H_2O$), acetone, or the like, or combinations thereof. Alternatively or in combination, the cleaning process may comprise venting the process chamber 200, for example, after purging the processing volume 204, the port 219, the conduit 220, and the pressure gauge 202 prior to opening the process chamber 200 to vent the processing volume 204 to atmosphere. At atmosphere, the process chamber may be serviced, worn out parts replaced or cleaned, or the like.

The inventor has discovered that the cleaning process, while advantageously removing contaminants from the interior surfaces and/or components of the process chamber 200, can leave behind a high enough moisture content within the process chamber 200 that may cause damage to the pressure gauge 202. In addition, the inventor has discovered that exposing the processing volume to air can also result in an undesirably high moisture content within the process chamber 200 that may cause damage to the pressure gauge 202. For example, the cleaning agents may comprise water, leaving behind moisture in the processing volume, and/or the venting of the process chamber 200 to atmosphere may allow ambient moisture from the atmosphere into the processing volume 204. For example, if exposed to the processing volume 204 at the level of moisture content present immediately after the cleaning process, or even after a delay of up to about 30 seconds, contaminants present on the pressure gauge 202 or in the port 219 or the conduit 220 may react with the moisture and lead to corrosion of the pressure gauge 202, or the moisture itself may corrode the pressure gauge 202, or a combination thereof.

Therefore, in some embodiments and as depicted at 106, a moisture content of the processing volume 204 may be reduced after completion of the cleaning process at 104 (or after sealing the process chamber after opening to atmosphere) to a desired moisture content. For example, in some embodiments, the desired moisture content is about 10% or less of an initial moisture content present after the cleaning process is completed at 104. In some embodiments, the processing volume 204 has a leak rate of about 2 mTorr/min or less at the desired moisture content. For example, the leak rate can be defined as the rate of pressure rise in the process chamber 200 when a vacuum pump, for example a vacuum pump 212 (discussed below), which is pumping on the processing volume 204 is turned off. The leak rate may be due a combination of ambient atmosphere leaking into the chamber (even though the chamber may be sealed) and residual moisture remaining from the cleaning process. For example, immediate after the process chamber 200 is cleaned at 104 and prior to reducing the moisture content at 106, the leak rate may be about 10 mTorr/min.

The moisture content can be reduced to the desired level in any suitable manner. For example, the processing volume 204 may be pumped down after the cleaning process is complete, for example by a vacuum pump 212 coupled to the process chamber 200 and fluidly coupled to the processing volume 204, to reduce the pressure in the processing volume 204. By pumping down the pressure within the process chamber 200, the vacuum pump 212 may remove the moisture content from the processing volume 204. For example, and in some embodiments, the pumping may continue until a desired pressure level is reached in the processing volume. In some embodiments, the desired pressure level is about 110 mTorr. In some embodiments, after reaching the desired pressure level, a desired period of time may be allowed elapse prior to opening the isolation valve 206 and exposing the pressure gauge 202. For example, and in some embodiments, the desired period of time may be about 5 minutes.

Alternatively or in combination, a purge gas, for example from a gas source 214 coupled to the process chamber 200, may be flowed into the processing volume 204 to facilitate removal of moisture from the processing volume. For example, the purge gas may be any suitable purge gas, for example a dry gas (e.g., having little or no water content) such as nitrogen ($N_2$), argon (Ar), helium (He), clean dry air (CDA), toxic gases, non-toxic gases, inert gases, non-inert gases or the like. The purge gas may aid in the removal of the moisture by the vacuum pump 210. Further, the processing volume may be repeatedly purged, for example, flowing purge gas into the processing volume and then removing the purge gas from the processing volume 204 using the vacuum pump 210 for a desired number of iterations or until the desired moisture content is reached.

An endpoint determination for reaching the desired moisture content may be made in several ways. For example, the processing volume may be pumped, or pumped and purged for a desired amount of time. The desired amount of time may be determined by one or more factors, such as the size of the processing volume 204, the strength of the pump 212, the flow rate of the purge gas from the gas source 214, or the like. The desired amount of time may be empirically determined or modeled based upon the above, or other, factors.

Alternatively, an endpoint detection system 216 may be coupled to the process chamber 200 and used to monitor the moisture content to determine when the desired moisture content has been reached. For example, the endpoint detection system 216 may be one or more of an optical spectrometer, a mass spectrometer, or any suitable detection system for determining the moisture content present in the processing volume 204. The endpoint detection system 216 may provide a signal when the desired moisture content is reached. For example, the signal may be a visual or audible alarm. Alternatively or in combination, the endpoint detection system 216 may be coupled to a controller 218 of the process chamber. The controller 218 may then provide the signal based upon data received from the endpoint detection system 216 indicating that the desired moisture content has been reached. Alternatively or in combination, the controller 218 may merely continue controlling the operation of the process chamber 200 upon determining that the desired moisture content has been reached.

The controller 218 may generally include a central processing unit (CPU), a memory, and support circuit. The CPU may be one of any form of a general purpose computer processor that can be used in an industrial setting. The support circuits may be coupled to the CPU and may comprise cache, clock circuits, input/output subsystems, power supplies, and the like. Software routines (such as the methods disclosed herein for limiting damage to the pressure gauge 202) may be stored in the memory of the controller 218, and may, when executed by the CPU, transform the CPU into a specific purpose computer (controller). The software routines may also be stored and/or executed by a second controller (not shown) that is located remotely from the process chamber 200, or alternatively, in individual controllers (not shown) of the various chamber components.

After determining (or presuming based upon elapsed time) that the desired moisture content has been reached, at 108, the pressure gauge may be exposed to the processing volume, for example by opening the isolation valve 206, to be ready to monitor the pressure in the process chamber for subsequent processes. In some embodiments, the controller 218 coupled to the process chamber 200 may open the isolation valve 206. Alternatively, the isolation valve 206 may be manually opened.

Figure 4:
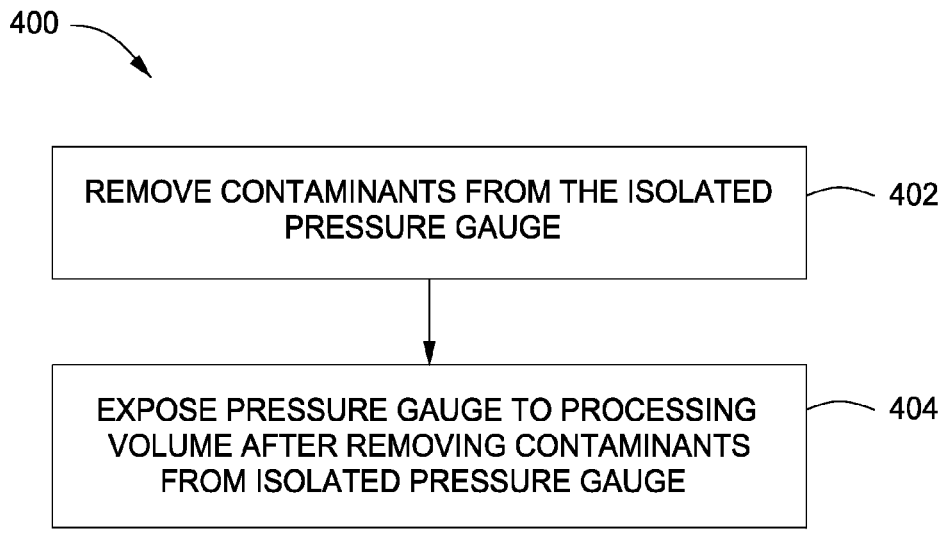
FIG. 4 depicts a flow chart for a method of extending the lifetime of a pressure gauge coupled to a process chamber in accordance to some embodiments of the present invention.

In addition to the method 100 discussed above, other techniques for reducing or limiting the damage to the pressure gauge 202 may be utilized alternatively to, or in combination with, the method 100. For example, FIG. 4 depicts a flow chart of a method 400 of extending the lifetime of a pressure gauge coupled to a process chamber in accordance with some embodiments of the present invention. The method 400 may be utilized individually, or in combination with the method 100 (and/or other methods disclosed herein).

The method 400 begins at 402 by removing some or all of the contaminants from the isolated pressure gauge 202. For example, at 402, the isolation valve 206 is in the closed position as discussed above at 102 of method 100. Further, the chamber 200 may be subject to the cleaning process (or exposed to air) before, during, after, or any combination thereof, the contaminants are removed at 402 and while the pressure gauge 202 is isolated from the processing volume 204. The contaminants can be removed from the pressure gauge 202 by any suitable process, such as the one or more techniques discussed below.

For example, in some embodiments, and as illustrated in FIG. 3, the isolated pressure gauge 202 may be detached from the process chamber 200. The pressure gauge 202 may be detached from the process chamber 202 at any suitable location, such as at the isolation valve 206 (as depicted in FIG. 3). The detached pressure gauge 202 may be heated, for example, in a non-moisture containing environment such as in the presence of a dry gas, such as argon (Ar), helium (He), or nitrogen ($N_2$), or any additional dry gases as discussed above to remove the contaminants. For example, the pressure gauge 202 may be heated to a temperature sufficient to volatilize the contaminants. In some embodiments, the heating of the pressure gauge 202 may be performed in an external vacuum chamber or any suitable heating non-moisture containing heating environment. For example, the pressure gauge 202 may be heated in a low pressure environment. The pressure gauge 202 may be heated for a time sufficient to remove some or all of the contaminants. After the heating process is complete, the pressure gauge 202 having the contaminants removed may be reattached to the process chamber 200.

Alternatively, a heater 224 may be provided to heat the pressure gauge 202. For example, the pressure gauge 202 may be wrapped in a heat blanket or with a flexible heater element (not shown), or a heater 222 may be placed proximate too or coupled to the pressure gauge 202 and/or the conduit 220. For example, a resistive heater element may be wrapped around the conduit 220 or placed adjacent to the conduit 220 to heat the conduit 220 and/or the pressure gauge 202. In such embodiments, the pressure gauge may remain coupled to the process chamber 200 (although the pressure gauge 202 may also be removed as well).

Alternatively, or in combination with heating the pressure gauge 202, the contaminants can be removed from the pressure gauge 202 by a vacuum pump fluidly coupled to the pressure gauge 202, for example, the vacuum pump 212 as shown in FIG. 2, or a separate vacuum pump (not shown) coupled to the pressure gauge 202 (or conduit 220). In some embodiments, a purge gas, for example, flowed from the gas source 214, can be utilized in alternatively or in combination with the vacuum pump 212 to facilitate removal of the contaminants from the surfaces of the pressure gauge 202. The pump and purge of the pressure gauge 202 is substantially similar to that discussed above for removing moisture from the processing volume 204 of the process chamber 200.

Next, at 404, the pressure gauge 202 having the contaminants removed at 402 can be exposed to the processing volume 204 after the cleaning process has been completed, or after the process chamber has been isolated from atmosphere (for example, by opening the isolation valve 206). In some embodiments, for example when utilized in combination with method 100 described above, the pressure gauge 202 having the contaminants removed at 402 may be exposed to the processing volume 204 after the moisture content has been reduced to the desired level (as described above at 106).

Figure 5:
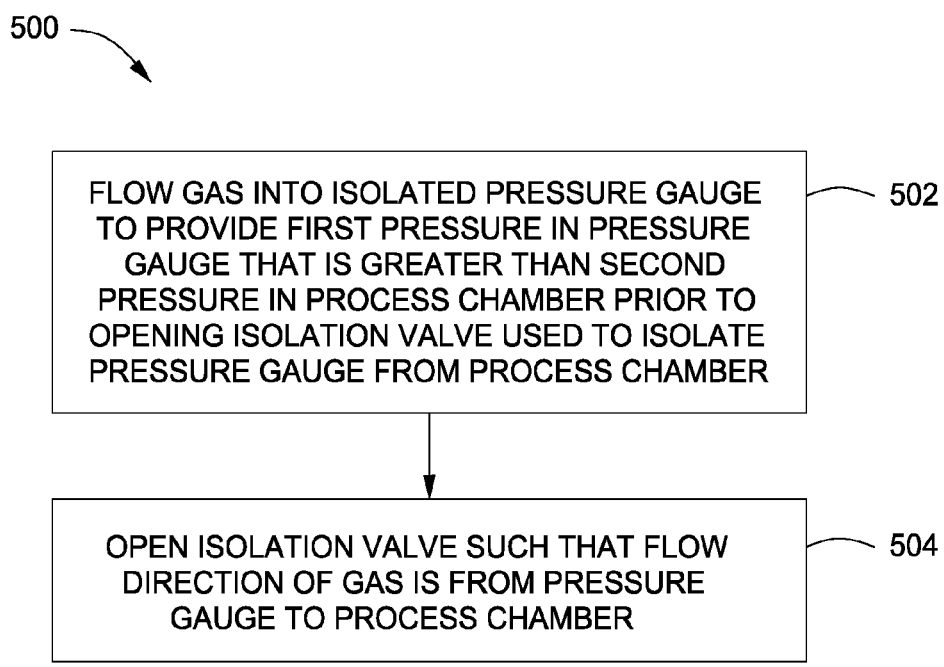
FIG. 5 depicts a flow chart for a method of extending the lifetime of a pressure gauge coupled to a process chamber in accordance to some embodiments of the present invention.

Alternatively or in combination with either or both of the methods 100 and 400, FIG. 5 depicts a flow chart of a method 500 of extending the lifetime of a pressure gauge coupled to a process chamber in accordance with some embodiments of the present invention. The method 500 begins at 502 by flowing a gas, for example a purge gas from the gas source 214, into the pressure gauge 202 such that a first pressure in the conduit 220 and the pressure gauge 202 is greater than a second pressure in the processing volume 204 of the process chamber 200 prior to opening the isolation valve 206 after the cleaning process has been completed or the process chamber isolated from atmosphere, for example, at 104. For example, and in some embodiments, the pressure gauge 202 may be isolated by closing the isolation valve 206 and then a purge gas provided by the gas source 214 may be flowed into the isolated conduit 220 and pressure gauge 202 until the first pressure is reached. Alternatively, if the method 500 is utilized in combination with either or both of the methods 100 and 400, then 502 may be performed after the moisture content in the processing volume 204 has been reduced to the desired level at 106 and/or the contaminants have been removed from the pressure gauge at 402. Alternatively, 502 may be performed prior to 102, where the processing volume 204 and the pressure gauge 202 are purged with a purge gas to provide the first pressure in the pressure gauge 202 prior to isolating the pressure gauge 202 from the processing volume 204.

The first pressure in the pressure gauge 202 may be greater than the second pressure in the processing volume 204 of the process chamber 200 such that when the isolation valve 206 is opened at 504 the flow of gas may be from the pressure gauge 202 to the processing volume 204, thus substantially preventing any remaining moisture (after the cleaning process, after the air exposure, or after the moisture content is reduced to the desired level) from entering the pressure gauge 202 and/or pushing any moisture or contaminants disposed in the pressure gauge 202 or conduit 220 into the processing volume 204. In some embodiments, the first pressure may be, for example, about 10 Torr and the second pressure may be, for example, about 0.5 Torr or less. In some embodiments, the first pressure may be greater than the second pressure by about 9.5 Torr or more, or by a sufficient differential to prevent backstreaming into the pressure gauge 202.

Thus, methods of extending the lifetime of a pressure gauge coupled to a process chamber have been disclosed herein. The inventive methods advantageously limit damage to the pressure gauge by reducing the moisture content resultant from a cleaning process or from exposing the processing volume to air to a desired level and/or by reducing contaminants present in the process chamber and/or the pressure gauge. For example, the inventive methods may limit damage to the pressure gauge by removing moisture from the processing volume after the cleaning process or air exposure (as described in method 100), or by removing contaminants from the pressure gauge 202 (as described in method 400), or by preventing moisture from entering the pressure gauge when the isolation valve is opened (as described in method 500). The methods 100, 400, and 500, and their variations and equivalents, may be utilized individually or in combination to limit damage to the pressure gauge 202, thereby extending its lifetime.

While the foregoing is directed to embodiments of the present invention, other and further embodiments of the invention may be devised without departing from the basic scope thereof.

The invention claimed is:

1. A method of extending the lifetime of a pressure gauge coupled to a process chamber, comprising:
   isolating the pressure gauge from a processing volume of the process chamber;
   increasing a moisture content of the processing volume to above a desired moisture level while the pressure gauge is isolated from the processing volume of the process chamber;
   reducing the moisture content of the processing volume to or below the desired moisture level, wherein the processing volume has a leak rate of about 2 mTorr/min or less at the desired moisture level;
   exposing the pressure gauge to the processing volume after reaching the desired moisture level: and
   heating the pressure gauge with a heater to remove at least some contaminants from the pressure gauge.

2. The method of claim 1, wherein isolating the pressure gauge further comprises isolating the pressure gauge while providing a purge gas to the processing volume, and further comprising:
   purging the processing volume and the pressure gauge with a purge gas prior to isolating the pressure gauge from the processing volume; and
   venting the processing volume after the pressure gauge is isolated.

3. The method of claim 1, further comprising:
   monitoring the moisture content with an endpoint detection system to determine when the desired moisture level is reached, or waiting for a period of time to determine when the desired moisture level is reached.

4. The method of claim 1, wherein reducing the moisture content of the processing volume comprises:
   removing moisture from the processing volume with a vacuum pump fluidly coupled to the processing volume until a desired pressure level is reached in the processing volume.

5. The method of claim 4, wherein exposing the pressure gauge to the processing volume further comprises:
exposing the pressure gauge to the processing volume after waiting for a desired time after the desired pressure level is reached.

6. The method of claim 4, wherein reducing the moisture content of the processing volume further comprises:
flowing a purge gas into the processing volume; and
removing the purge gas with the vacuum pump to remove moisture from the processing volume.

7. The method of claim 1, further comprising:
detaching the isolated pressure gauge from the process chamber prior to heating the pressure gauge to remove at least come contaminants from the pressure gauge; and
reattaching the pressure gauge to the process chamber after removing at least some of the contaminants.

8. The method of claim 7, wherein reattaching the pressure gauge further comprises:
reattaching the pressure gauge to the process chamber after the desired moisture content is reached.

9. The method of claim 1, wherein increasing the moisture content of the process chamber comprises at least one of:
performing a cleaning process in the process chamber; or
allowing air to enter the processing volume.

10. A method of extending the lifetime of a pressure gauge coupled to a process chamber, comprising:
isolating the pressure gauge from a processing volume of the process chamber;
increasing a moisture content of the processing volume to above a desired moisture level while the pressure gauge is isolated from the processing volume of the process chamber;
removing contaminants from the isolated pressure gauge with a vacuum pump fluidly coupled to the isolated pressure gauge; and
exposing the pressure gauge to the processing volume after removing contaminants from the isolated pressure gauge.

11. The method of claim 10, wherein removing contaminants from the isolated pressure gauge further comprises:
flowing a purge gas into the pressure gauge to remove the contaminants from the surfaces of the pressure gauge and removing the purge gas with the vacuum pump to remove the contaminants from the isolated pressure gauge.

12. The method of claim 10, further comprising:
reducing the moisture content of the processing volume to or below the desired moisture level, wherein the processing volume has a leak rate of about 2 mTorr/min or less at the desired moisture level; and
exposing the pressure gauge to the processing volume after reaching the desired moisture level.

13. The method of claim 12, wherein reducing the moisture content of the processing volume comprises:
removing moisture from the processing volume with a vacuum pump fluidly coupled to the processing volume; and optionally, flowing a purge gas into the processing volume and removing the purge gas with the vacuum pump to remove moisture from the processing volume.

14. The method of claim 10, wherein increasing the moisture content of the process chamber comprises at least one of:
performing a cleaning process in the process chamber; or
allowing air to enter the processing volume.

15. A method of extending the lifetime of a pressure gauge coupled to a process chamber, comprising:
isolating the pressure gauge from a processing volume of the process chamber;
increasing a moisture content of the processing volume to above a desired moisture level while the pressure gauge is isolated from the processing volume of the process chamber;
flowing a gas into the pressure gauge to provide a first pressure in the pressure gauge that is greater than a second pressure in the processing volume, the flowing occurring after closing and prior to opening an isolation valve used to isolate the pressure gauge from the process chamber; and
opening the isolation valve such that a flow direction of the gas is from the pressure gauge to the process chamber.

16. The method of claim 15, further comprising:
reducing a moisture content of the processing volume process to a desired moisture level, wherein the processing volume has a leak rate of about 2 mTorr/min or less at the desired moisture level; and
exposing the pressure gauge to the processing volume after reaching the desired moisture level.

17. The method of claim 16, wherein reducing the moisture content of the processing volume comprises:
removing moisture from the processing volume with a vacuum pump fluidly coupled to the processing volume until the second pressure is reached in the processing volume; and
optionally, flowing a purge gas into the processing volume and removing the purge gas with the vacuum pump to remove moisture from the processing volume.

18. The method of claim 15, wherein increasing the moisture content of the process chamber comprises at least one of:
performing a cleaning process in the process chamber; or
allowing air to enter the processing volume.

* * * * *